United States Patent
Jung et al.

(10) Patent No.: US 11,283,019 B2
(45) Date of Patent: Mar. 22, 2022

(54) RESISTANCE RANDOM ACCESS MEMORY DEVICE AND FABRICATING METHOD OF THE SAME

(71) Applicant: Research & Business Foundation Sungkyunkwan University, Suwon-si (KR)

(72) Inventors: Hyun Suk Jung, Seoul (KR); SangMyeong Lee, Gimhae-si (KR); Won Bin Kim, Suwon-si (KR); Jae Myeong Lee, Jincheon-gun (KR); Ohyeong Gong, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 19 days.

(21) Appl. No.: 16/704,116

(22) Filed: Dec. 5, 2019

(65) Prior Publication Data
US 2020/0212300 A1    Jul. 2, 2020

(30) Foreign Application Priority Data

Dec. 31, 2018 (KR) .................. 10-2018-0173728
Jan. 8, 2019 (KR) .................. 10-2019-0002306

(51) Int. Cl.
*H01L 45/00* (2006.01)
*H01L 27/24* (2006.01)
*G11C 13/00* (2006.01)

(52) U.S. Cl.
CPC ........ *H01L 45/148* (2013.01); *G11C 13/0007* (2013.01); *G11C 13/0069* (2013.01);
(Continued)

(58) Field of Classification Search
CPC .............. H01L 45/148; H01L 45/1608; H01L 45/1253; H01L 27/2463; H01L 45/08; H01L 45/1233; H01L 45/14; C01G 29/00
See application file for complete search history.

(56) References Cited

U.S. PATENT DOCUMENTS

| | | | | |
|---|---|---|---|---|
| 7,408,212 B1* | 8/2008 | Luan | .................. | G11C 13/0007 257/295 |
| 2014/0211535 A1* | 7/2014 | Nickel | ............... | G11C 13/0002 365/148 |

(Continued)

FOREIGN PATENT DOCUMENTS

| | | |
|---|---|---|
| KR | 10-2015-0010645 A | 1/2015 |
| KR | 10-2017-0049758 A | 5/2017 |

(Continued)

OTHER PUBLICATIONS

Liu, Y. et al. Resistive switching memory based on organic/inorganic hybrid perovskite materials, Vacuum, vol. 130, 2016, pp. 109-112, ISSN 0042-207X, https://doi.org/10.1016/j.vacuum.2016.05.010 (Year: 2016).*

(Continued)

*Primary Examiner* — Jerome Leboeuf
(74) *Attorney, Agent, or Firm* — NSIP Law

(57) ABSTRACT

The present disclosure relates to a resistance random access memory device, including a first electrode, a resistance change layer formed on the first electrode, and a second electrode formed on the resistance change layer, and the resistance change layer includes a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure.

6 Claims, 22 Drawing Sheets

(52) U.S. Cl.
   CPC ...... *H01L 27/2463* (2013.01); *H01L 45/1253* (2013.01); *H01L 45/1608* (2013.01)

(56) References Cited

U.S. PATENT DOCUMENTS

2019/0074439 A1\* 3/2019 Banerjee ............. H01L 45/1616
2020/0194669 A1\* 6/2020 Jang ................... H01L 45/1253

FOREIGN PATENT DOCUMENTS

| KR | 10-2017-0113454 A | 10/2017 |
| KR | 10-1828131 B1 | 2/2018 |

OTHER PUBLICATIONS

Hwang, B. et al. Lead-free, air-stable hybrid organic-inorganic perovskite resistive switching memory with ultrafast switching and multilevel data storage, Nanoscale, 2018, 10-18, pp. 8578-8584, https://doi.org/10.1039/C8NR00863A. (Year: 2018).\*
S. J. Yoon, et al., ACS Energy Letters 2017 2 (7), 1507-1514, DOI: 10.1021/acsenergylett.7b00357 (Year: 2017).\*
Creutz, Sidney E. et al., "Colloidal nanocrystals of lead-free double-perovskite (elpasolite) semiconductors: synthesis and anion exchange to access new materials." *Nano letters*, 18, No. 2, 2018 (pp. 1-19).
Korean Office Action dated May 21, 2020 in counterpart of Korean Patent Application No. 10-2018-0173728 (5 pages in Korean).
Korean Office Action dated May 21, 2020 in counterpart of Korean Patent Application No. 10-2019-0002306 (5 pages in Korean).

\* cited by examiner

FIG.14
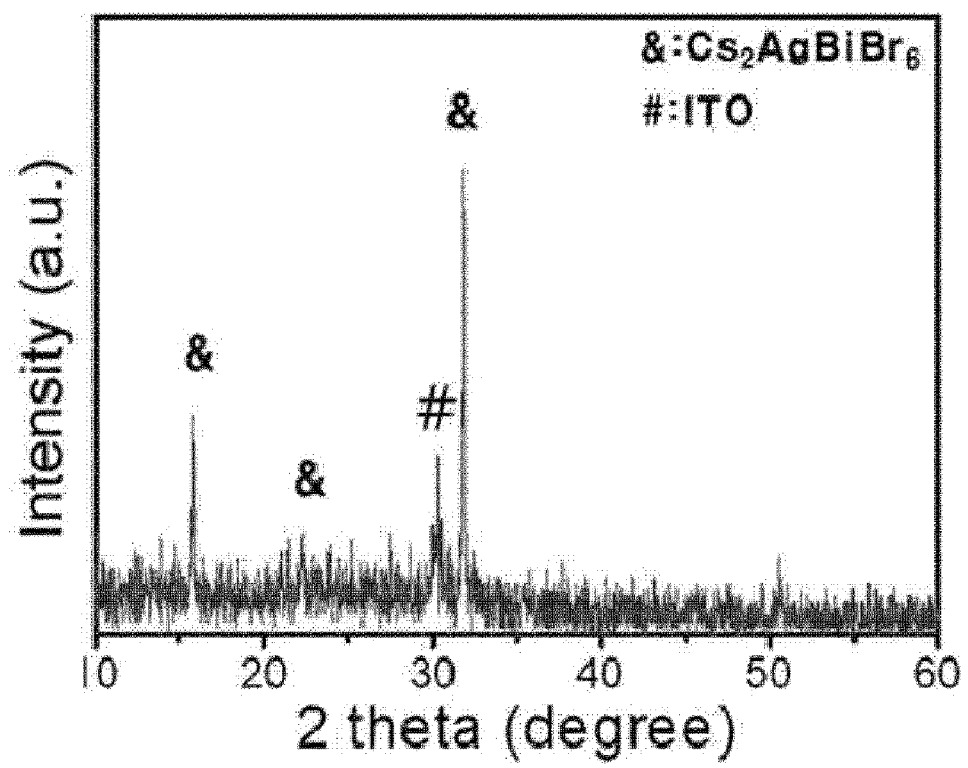

RESISTANCE RANDOM ACCESS MEMORY DEVICE AND FABRICATING METHOD OF THE SAME

CROSS-REFERENCE TO RELATED APPLICATION

This application claims the benefit of Korean Patent Application No. 10-201.8-0173728 filed on Dec. 31, 2018 and Korean Patent Application No. 10-2019-0002306 filed Jan. 8, 2019, the disclosures of which are incorporated herein by reference.

TECHNICAL FIELD

The present disclosure relates to a resistance random access memory device and a method of fabricating the same.

BACKGROUND

A non-volatile memory has the advantage of ROM in that information stored therein is not erased even when power is not supplied and the advantage of RAM in that information can be easily input and output. Thus, the non-volatile memory is suitable for a mobile device such as a mobile phone, or the like. Examples of the non-volatile memory may include a resistance random access memory (RRAM), a magnetic random access memory (MRAM), a ferroelectric random access memory (FRAM), a phase-change random access memory (PRAM), and the like. Particularly, the resistance random access memory is one of the next-generation non-volatile memory devices with considerable competitiveness as compared with flash memory due to its features of low power, ultra-high speed, non-volatility, and simple structure.

A resistance random access memory device which has received a lot of attention as a next-generation memory device due to its high-density and low-power characteristics may increase or decrease an electric resistance using an electric signal to record information depending on a resistance state. The resistance random access memory device employs a simple device structure (metal/oxide/metal) and is configured to record information by increasing or decreasing a resistance value of the oxide when an appropriate voltage/current is applied. These two resistance states are distinguished by a difference between "0" and "1" and the resistance random access memory device refers to a memory device that recognizes the resistance states.

Resistance random access memory devices can be classified by the mechanism of resistance switching. For example, the resistance random access memory devices are classified into a phase-change access memory (PRAM) in which a resistance is changed by phase change, a magnetic RAM (MRAM) in which a resistance is changed by spin change, and a resistance RAM (RRAM) in which a resistance is changed by the movement of ions in a material.

In a resistance random access memory device, a layer in which a resistance is changed is referred to as a resistance change layer. In general, oxides are mainly used as a resistance change layer. However, an oxide-based resistance change layer needs to be formed at high temperatures and in a vacuum, which makes it difficult to reduce manufacturing costs and implement a flexible memory device and also makes it difficult to control a resistance change of the resistance change layer.

To solve the above-described problems of the oxide-based resistance change layer, a resistance change layer using a perovskite material $APbX_3$ instead of oxides has been researched. A resistance random access memory device using $APbX_3$ has characteristics of low voltage and high efficiency. However, $APbX_3$ contains lead and thus can cause environmental pollution.

Korean Patent No. 10-1828131 which is the background technology of the present disclosure relates to a resistance change memory device including organic-inorganic hybrid perovskite as a resistance change layer and a method of fabricating the same. In this patent document, a perovskite material containing lead is used as a resistance change layer and a resistance change layer without using lead is not mentioned.

SUMMARY

In view of the foregoing, the present disclosure provides a resistance random access memory device.

Further, the present disclosure provides a method of fabricating the resistance random access memory device.

However, problems to be solved by the present disclosure are not limited to the above-described problems. There may be other problems to be solved by the present disclosure.

According to a first aspect of the present disclosure, there is provided a resistance random access memory device including a first electrode, a resistance change layer formed on the first electrode, and a second electrode formed on the resistance change layer, and the resistance change layer includes a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure.

According to an embodiment of the present disclosure, the resistance random access memory device may change in resistance due to the movement of I ions in the resistance change layer or a point defect of the thin film, but may not be limited thereto.

According to an embodiment of the present disclosure, the resistance random access memory device may have a driving voltage in the range of from −1.0 V to +1.0 V, but may not be limited thereto.

According to an embodiment of the present disclosure, the first electrode and the second electrode may be arranged perpendicular to each other, but may not be limited thereto.

According to an embodiment of the present disclosure, the resistance change layer may not contain lead (Pb), but may not be limited thereto.

According to an embodiment of the present disclosure, the resistance random access memory device may further include a polymer protective layer formed on the resistance change layer, but may not be limited thereto.

According to an embodiment of the present disclosure, the polymer protective layer may contain a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride hexafluoropropylene, polyethyleneimine, polyphenylene terephthalamide, polymethoxy polyethylene glycol methacrylate, poly(2-methoxyethyl glycidyl ether), and combinations thereof, but may not be limited thereto.

According to an embodiment of the present disclosure, the first electrode and the second electrode may contain each independently a material selected from the group consisting of Pt, Ti, Ag, Au, Ni, Zr, Ta, Zn, Nb, Cr, Co, Mn, Fe, Al, Mg, Si, W, Cu, lanthanum-based metals, nitrides thereof, oxides thereof, and combinations thereof, but may not be limited thereto.

According to a second aspect of the present disclosure, there is provided a method of fabricating a resistance random access memory device, including depositing a first electrode on a substrate, depositing a resistance change layer including a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure on the first electrode, and depositing a second electrode on the resistance change layer.

According to an embodiment of the present disclosure, the depositing of the resistance change layer may include supplying a precursor containing each of Cs, Ag, or Bi together with heat onto the first electrode to form a thin film thereon, but may not be limited thereto.

According to an embodiment of the present disclosure, the method of fabricating a resistance random access memory device may further include forming a polymer protective layer on the resistance change layer after the depositing of the resistance change layer, but may not be limited thereto.

According to an embodiment of the present disclosure, the polymer protective layer may be coated by a method selected from the group consisting of spin coating, bar coating, nozzle printing, spray coating, slot die coating, gravure printing, ink jet printing, screen printing, electrohydrodynamic jet printing, electrospray, and combinations thereof, but may not be limited thereto.

According to an embodiment of the present disclosure, a solvent used for the coating may contain a material selected from the group consisting of chlorobenzene, pyridine, aniline, dimethylformamide, dimethyl sulfoxide, dimethylacetamide, N-methylpyrrolidone, N-methyl-2-pyridine, branched alcohol having 3 to 6 carbon atoms, and combinations thereof, but may not be limited thereto.

According to an embodiment of the present disclosure, the substrate may contain a material selected from the group consisting of FTO, Si, $SiO_2$, SiC, Ga, SiGe, ITO, $Al_2O_3$, InAs, GaAs, InP, GaN, InGaAs, InAlAs, GaSb, AlSb, AlP, GaP, and combinations thereof, but may not be limited thereto.

The above-described aspects are provided by way of illustration only and should not be construed as liming the present disclosure. Besides the above-described embodiments, there may be additional embodiments described in the accompanying drawings and the detailed description.

According to the above-described aspects of the present disclosure, a resistance random access memory device according to the present disclosure does not contain lead (Pb) and thus can overcome the environmental problem.

Also, the resistance random access memory device according to the present disclosure includes a resistance change layer based on bismuth halide and/or having an elpasolite crystalline structure and thus can have characteristics of low voltage and high efficiency.

However, the effects to be obtained by the present disclosure are not limited to the above-described effects. There may be other effects to be obtained by the present disclosure.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 14 is an XRD graph of $Cs_2AgBiBr_6$ according to a comparative example of the present disclosure.

DETAILED DESCRIPTION

Figure 1:
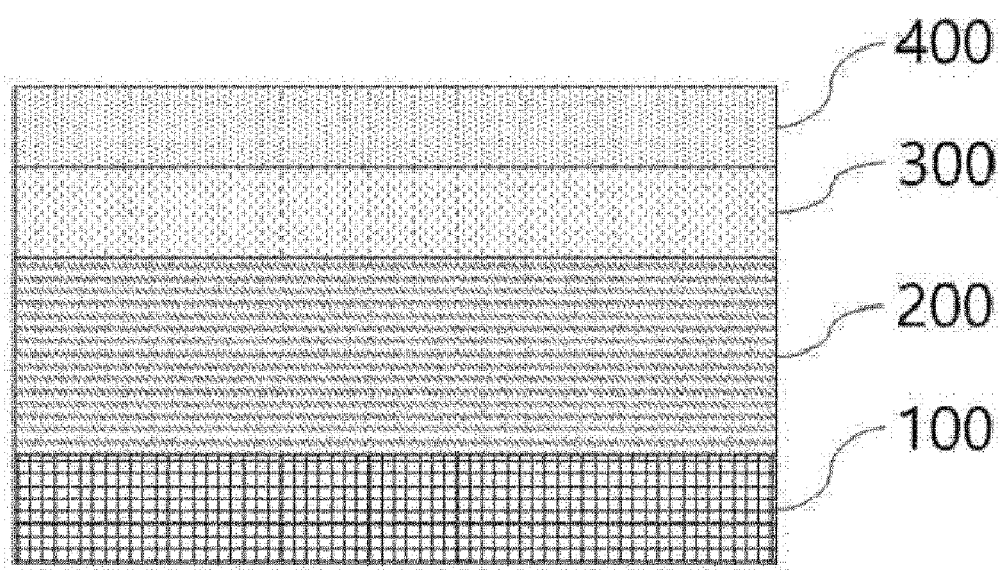
FIG. 1 is a conceptual diagram schematically illustrating a resistance random access memory device according to an embodiment of the present disclosure.

Hereinafter, embodiments of the present disclosure will be described in detail with reference to the accompanying drawings so that the present disclosure may be readily implemented by those skilled in the art.

However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereafter, a resistance random access memory device and a method of fabricating the same according to the present disclosure will be described in detail with reference to embodiments, examples, and the accompanying drawings. However, the present disclosure may not be limited to the following embodiments, examples, and drawings.

FIG. 1 is a conceptual diagram schematically illustrating a resistance random access memory device according to an embodiment of the present disclosure.

A first aspect of the present disclosure provides a resistance random access memory device, including a first electrode 100, a resistance change layer 200 formed on the first electrode 100, and a second electrode 400 formed on the resistance change layer 200, and the resistance change layer 200 includes a bismuth halide-based $BiI_xBr_{3-x}$ thin film (where $0 \le x \le 3$) and/or a $Cs_2AgBiBr_xI_{6-x}$ thin film (where $0 \le x \le 6$) having an elpasolite structure.

In a general resistance random access memory device, the physical mechanism of change in resistance is not about confining electrons in a specific space but about using the movement of atoms or ions in a material depending on the external environment. Therefore, the general resistance random access memory device does not need a separate space for confining electrons unlike existing memory devices and thus can be fabricated more finely than the existing memory devices.

A resistance change layer used in the general resistance random access memory device may contain a material selected from the group consisting of oxides, hexagonal boron nitrides, graphene, transition metal chalcogenide compounds, perovskite, and combinations thereof.

If $APbX_3$ (where A is a monovalent organic ammonium or metal cation, and X is a halogen ion) is used as perovskite in the resistance change layer, it is possible to fabricate a resistance random access memory device with low voltage and high efficiency. However, $APbX_3$ is prepared using lead (Pb) and thus can cause problems involving environmental pollution during preparation or disposal.

To solve the problems involving environmental pollution caused by $APbX_3$, a bismuth halide material and/or a material having an elpasolite structure instead of $APbX_3$ may be used as a resistance change layer. The bismuth halide material refers to a conjugate of bismuth (Bi) and halides consisting of F, Cl, Br, I, and combinations thereof, and the material having an elpasolite structure may be represented by $AA'BB'X_6$, and in this formula, A, A', B, and B' are metal cations or organic ammonium ions and X is a halogen ion.

The bismuth halide material and the material having an elpasolite structure are prepared without using Pb and thus may cause fewer problems involving environmental pollution.

Figure 3:
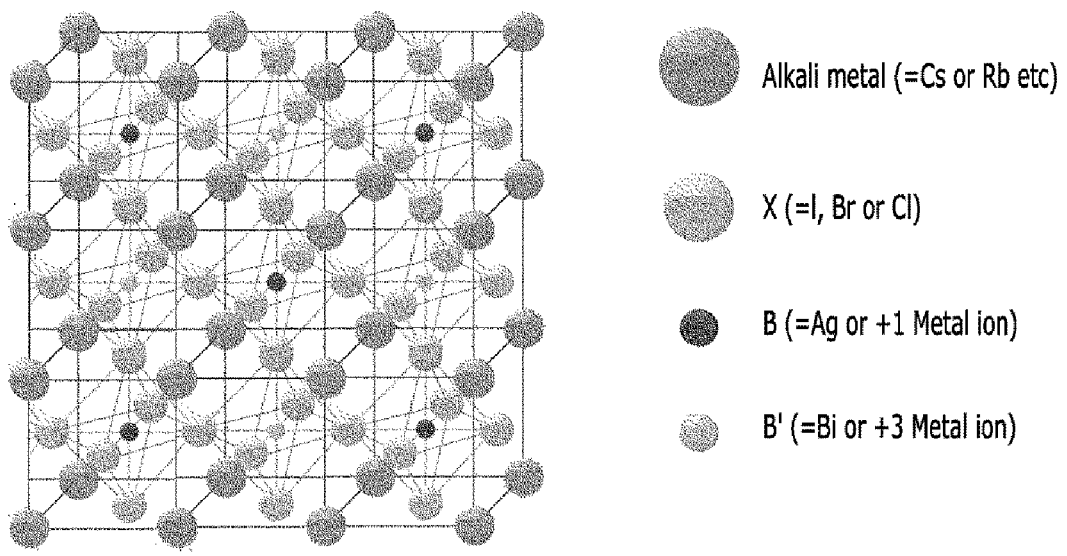
FIG. 3 is a schematic diagram showing an elpasolite crystalline structure according to an embodiment of the present disclosure.

FIG. 3 is a schematic diagram showing an elpasolite crystalline structure according to an embodiment of the present disclosure.

Referring to FIG. 3, the elpasolite structure includes $ABX_3$ and $A'B'X_3$ which are periodically arranged and thus has a regular crystalline structure represented by $AA'BB'X_6$ in the long term. The material having an elpasolite structure may also be referred to as "elpasolite material".

The elpasolite material may be used as a superconductor or a light absorbing layer.

According to an embodiment of the present disclosure, the resistance random access memory device may change in resistance due to the movement of I ions in the resistance change layer 200 or a point defect of the thin film, but may not be limited thereto.

The point defect refers to a defect in atomic unit and can be classified into a vacancy, an interstitial impurity atom, or a substitutional impurity atom. The point defect may be present within any crystalline solid. The point defect may cause the minimization of free energy, and, thus, the solid can be present in a thermally stable state.

For example, the resistance change layer 200 may have the point defect including the vacancy or the interstitial impurity atom. Therefore, the resistance change layer 200 may change in resistance due to the movement of atoms or electrons caused by the movement of I ions or the point defect, but may not be limited thereto.

According to an embodiment of the present disclosure, the resistance random access memory device may have a driving voltage in the range of from −1.0 V to +1.0 V, but may not be limited thereto. For example, the resistance random access memory device may have a driving voltage in the range of from −1.0 V to +0.5 V, from −0.9 V to +0.5 V, from −0.8 V to +0.5 V, from −0.7 V to +0.5 V, from −0.6 V to +0.5 V, from −0.5 V to +0.5 V, from −0.4 V to +0.5 V, from −0.3 V to +0.5 V, from −0.2 V to +0.5 V, from −0.1 V to +0.5 V, from 0 V to +0.5 V, from +0.1 V to +0.5 V, from +0.2 V to +0.5 V, from +0.3 V to +0.5 V, from +0.4 V to +0.5 V, from −1.0 V to +0.4 V, from −1.0 V to +0.3 V, from −1.0 V to +0.2 V, from −1.0 V to +0.1 V, from −1.0 V to 0 V, from −1.0 V to −0.1 V, from −1.0 V to −0.2 V, from −1.0 V to −0.3 V, from −1.0 V to −0.4 V, from −1.0 V to −0.5 V, from −1.0 V to −0.6 V, from −1.0 V to −0.7 V, from −1.0 V to −0.8 V, or from −1.0 V to −0.9 V, but may not be limited thereto.

The range of driving voltage refers to a range of from a voltage at which a set operation occurs to a voltage at which a reset operation occurs in the resistance random access memory device. In the set operation, the resistance random access memory device is switched from a low resistance state (LRS) to a high resistance state (HRS), and in the reset operation, the resistance random access memory device is switched from the high resistance state (HRS) to the low resistance state (LRS).

According to an embodiment of the present disclosure, the first electrode 100 and the second electrode 400 may be arranged perpendicular to each other, but may not be limited thereto.

In the resistance random access memory device, a local electric field may be generated on a surface on which the first electrode 100 and the second electrode 400 are arranged perpendicular to each other. Through the resistance change layer 200 applied with the local electric field, electrons are moved. Therefore, the resistance random access memory device can serve as a memory device.

According to an embodiment of the present disclosure, the resistance random access memory device may further include a polymer protective layer 300 formed on the resistance change layer 200, but may not be limited thereto.

The polymer protective layer 300 may serve to protect the resistance change layer 200 against external oxygen or moisture, but may not be limited thereto.

According to an embodiment of the present disclosure, the polymer protective layer 300 may contain a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride hexafluoropropylene, polyethyleneimine, polyphenylene terephthalamide, polymethoxy polyethylene glycol methacrylate, poly(2-methoxyethyl glycidyl ether), and combinations thereof, but may not be limited thereto.

According to an embodiment of the present disclosure, the first electrode 100 and the second electrode 400 may contain each independently a material selected from the group consisting of Pt, Ti, Ag, Au, Ni, Zr, Ta, Zn, Nb, Cr, Co, Mn, Fe, Al, Mg, Si, W, Cu, lanthanum-based metals, nitrides thereof, oxides thereof, and combinations thereof, but may not be limited thereto.

Figure 2:
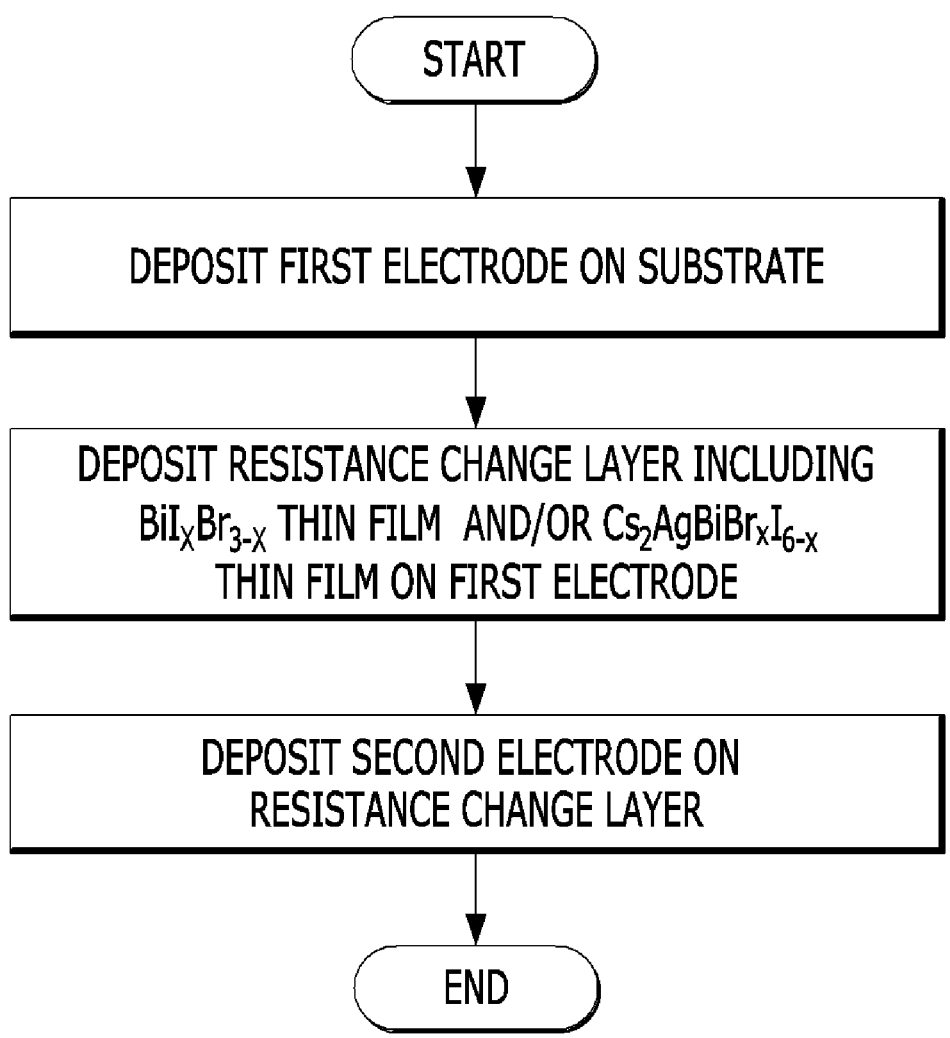
FIG. 2 is a flowchart showing a method of fabricating a resistance random access memory device according to an embodiment of the present disclosure.

FIG. 2 is a flowchart showing a method of fabricating a resistance random access memory device according to an embodiment of the present disclosure.

A second aspect of the present disclosure provides a method of fabricating a resistance random access memory device, including depositing the first electrode 100 on a substrate, depositing the resistance change layer 200 including a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure on the first electrode 100, and depositing the second electrode 400 on the resistance change layer 200.

Detailed descriptions of the method of fabricating a resistance random access memory device according to the second aspect of the present disclosure, which overlap with some parts of the first aspect of the present disclosure, are omitted hereinafter, but the descriptions of the first aspect of the present disclosure may be identically applied to the second aspect of the present disclosure, even though they are omitted hereinafter.

First, the first electrode 100 is deposited on the substrate (S100).

According to an embodiment of the present disclosure, the substrate may contain a material selected from the group consisting of FTO, ITO, Si, $SiO_2$, SiC, Ga, SiGe, $Al_2O_3$, InAs, GaAs, InP, GaN, InGaAs, InAlAs, GaSb, AlSb, AlP, GaP, and combinations thereof, but may not be limited thereto.

A method of depositing the first electrode 100 on the substrate which will be described later may be physical vapor deposition, but may not be limited thereto.

Then, the resistance change layer 200 including a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure is deposited on the first electrode 100 (S200).

According to an embodiment of the present disclosure, the depositing of the resistance change layer 200 may include supplying a precursor containing each of Cs, Ag, or Bi together with heat onto the first electrode 100 to form a thin film thereon, but may not be limited thereto.

To be specific, the precursor containing a material selected from the group consisting of Bi, Br, I, Cs, Ag, and combinations thereof and heat are supplied together onto the first electrode 100, and, thus, the resistance change layer 200 including a bismuth halide-based $BiI_xBr_{3-x}$ thin film (where $0 \leq x \leq 3$) and/or a $Cs_2AgBiBr_xI_{6-x}$ thin film (where $0 \leq x \leq 6$) having an elpasolite structure may be formed on the first electrode 100, but may not be limited thereto.

For example, the precursor may contain Bi, $I_2$, $Br_2$, $BiI_3$, $BiBr_3$, CsBr, $BiBr_3$, $CsBiBr_4$, AgBr, AgI, CsI, $CsAgBr_2$, or $CsAgI_2$ but may not be limited thereto.

According to an embodiment of the present disclosure, the resistance change layer 200 may include a $BiI_xBR_{3-x}$ thin film (where $0 \leq x \leq 3$) and/or a $Cs_2AgBiBr_xI_{6-x}$ thin film (where $0 \leq x \leq 6$), but may not be limited thereto. If a point defect is present on the $BiI_xBr_{3-x}$ thin film or the $Cs_2AgBiBr_xI_6$ thin film or the oxidation number of Bi, Cs, or Ag ions is changed, at least one of I atoms in the $BiI_xBr_{3-x}$ or $Cs_2AgBiBr_xI_6$ thin film may be substituted with a vacancy, but may not be limited thereto. That is, the resistance change layer 200 may change in resistance due to the point defect.

According to an embodiment of the present disclosure, the method of fabricating a resistance random access memory device may further include forming the polymer protective layer 300 on the resistance change layer 200 after the depositing of the resistance change layer 200, but may not be limited thereto.

According to an embodiment of the present disclosure, the polymer protective layer 300 may be coated by a method selected from the group consisting of spin coating, bar coating, nozzle printing, spray coating, slot die coating, gravure printing, ink jet printing, screen printing, electrohydrodynamic jet printing, electrospray, and combinations thereof, but may not be limited thereto.

Desirably, the polymer protective layer 300 may be coated by spin coating.

The spin coating refers to a method for coating a thin film of a solution on a substrate by dropping or coating the solution on the substrate and spinning the substrate at high speed. Further, the spin coating is advantageous when coating a low-viscosity solution.

According to an embodiment of the present disclosure, a solvent used for the coating may contain a material selected from the group consisting of chlorobenzene, pyridine, aniline, dimethylformamide, dimethyl sulfoxide, dimethylacetamide, N-methylpyrrolidone, N-methyl-2-pyridine, branched alcohol having 3 to 6 carbon atoms, and combinations thereof, but may not be limited thereto.

To sum up, the polymer protective layer 300 is formed by spin coating a solution containing the solvent and a material selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride hexafluoropropylene, polyethyleneimine, polyphenylene terephthalamide, polymethoxy polyethylene glycol methacrylate, poly(2-methoxyethyl glycidyl ether), and combinations thereof, but may not be limited thereto.

Then, the second electrode 400 is deposited on the resistance change layer 200 (S300).

According to an embodiment of the present disclosure, the first electrode 100, the resistance change layer 200, and the second electrode 400 may be deposited by physical vapor deposition, but may not be limited thereto. For example, the physical vapor deposition may include a method selected from the group consisting of thermal deposition, sputtering, electron beam deposition, pulse laser deposition, and combinations thereof, but may not be limited thereto.

Desirably, the resistance change layer 200 may be formed by thermal deposition, and the first electrode 100 and the second electrode 400 may be formed by sputtering, but may not be limited thereto.

According to an embodiment of the present disclosure, the first electrode 100 and the second electrode 400 on the resistance random access memory device may be arranged perpendicular to each other, but may not be limited thereto.

According to an embodiment of the present disclosure, the resistance random access memory device may have a crossbar array structure.

The crossbar array structure refers to a structure which includes a lower electrode, a resistance change material, and an upper electrode and in which the resistance change material is located between the lower electrode and the upper electrode and the lower electrode and the upper electrode are arranged perpendicular to each other. The crossbar array structure is simple and can be stacked easily and thus can increase the degree of integration of the resistance random access memory device.

Hereinafter, the present disclosure will be described in more detail with reference to examples. The following examples are provided only for explanation, but do not intend to limit the scope of the present disclosure.

Example 1

An FTO substrate including a Pt/Ti electrode deposited thereon was prepared. Then, Bi, I, and Br precursors were supplied at a ratio of 1:2.1:0.8 together with heat onto the substrate to form a $Bi(I_{0.7}/Br_{0.3})_3$ thin film on the substrate at room temperature. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Example 2

An FTO substrate including a Pt/Ti electrode deposited thereon was prepared. Then, Bi, I, and Br precursors were supplied at a ratio of 1:1.5:1.5 together with heat onto the substrate to form a $Bi(I_{0.5}/Br_{0.5})_3$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Example 3

An FTO substrate including a Pt/Ti electrode deposited thereon was prepared. Then, Bi, I, and Br precursors were supplied at a ratio of 1:0.9:2.1 together with heat onto the substrate to form a $Bi(I_{0.3}/Br_{0.7})_3$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Example 4

An Si substrate including a Pt/Ti electrode deposited thereon was prepared. Then, Cs, Ag, Bi, Br, and I precursors were supplied at a ratio of 2:1:1:4:2 together with heat onto the substrate to form a $Cs_2AgBiBr_4I_2$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Example 5

An Si substrate including a Pt/Ti electrode deposited thereon was prepared. Then, Cs, Ag, Bi, Br, and I precursors were supplied at a ratio of 2:1:1:3:3 together with heat onto the substrate to form a $Cs_2AgBiBr_3I_3$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Comparative Example 1

An FTO substrate including a Pt/Ti electrode deposited thereon was prepared. Then, Bi and I precursors were supplied together with heat onto the substrate to form a $BiI_3$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Comparative Example 2

An FTO substrate including a Pt/Ti electrode deposited thereon was prepared. Then, Bi and Br precursors were supplied together with heat onto the substrate to form a $BiBr_3$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Comparative Example 3

An Si substrate including a Pt/Ti electrode deposited thereon was prepared. Then, Cs, Ag, Bi, and Br precursors were supplied at a ratio of 2:1:1:6 together with heat onto the substrate to form a $Cs_2AgBiBr_6$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Comparative Example 4

An Si substrate including a Pt/Ti electrode deposited thereon was prepared. Then, Cs, Ag, Bi, and I precursors were supplied at a ratio of 2:1:1:6 together with heat onto the substrate to form a $Cs_2AgBiI_6$ thin film on the substrate. A solution of polymethyl methacrylate-chlorobenzene having a concentration of 2 mg/ml was coated on the thin film and then spin coated to deposit a polymer protective layer. After the polymer protective layer was deposited, silver was deposited to 50 nm or more on the polymer protective layer under a pressure of $10^{-6}$ Torr to form a silver electrode.

Test Example 1

Figure 4:
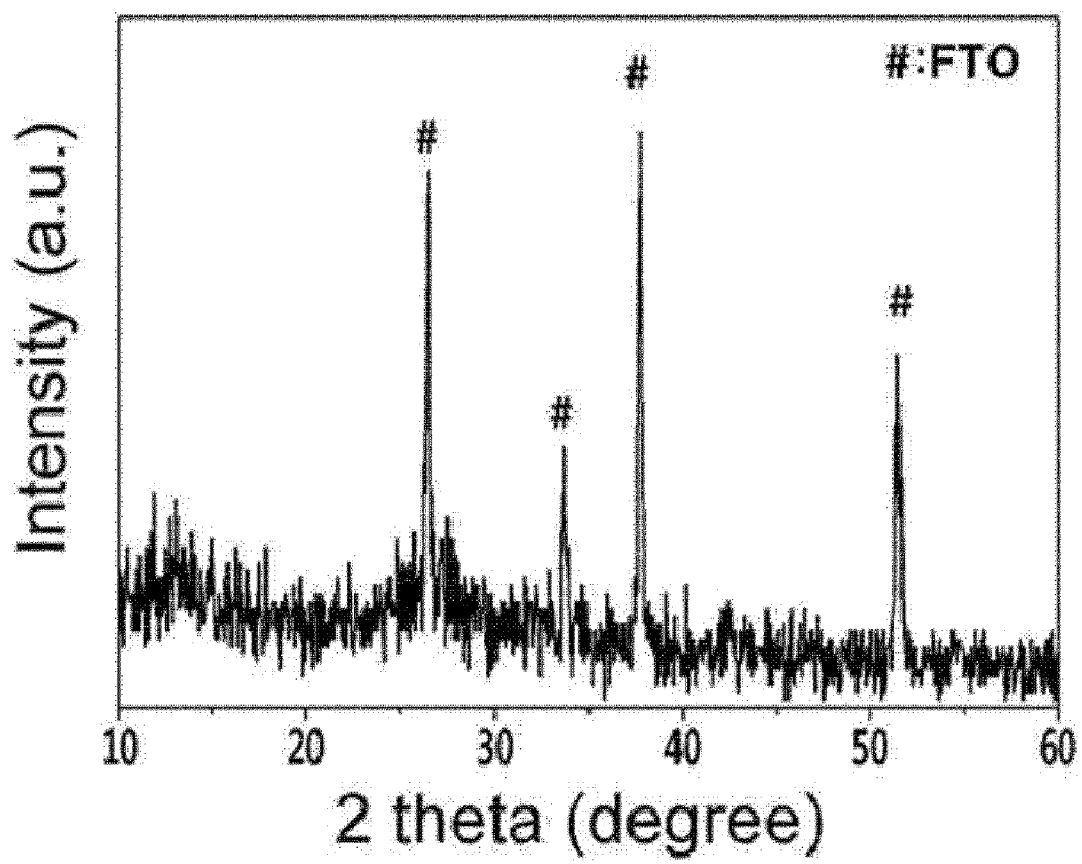
FIG. 4 is an XRD graph of $Bi(I/Br)_3$ according to an example of the present disclosure.
Figure 5:
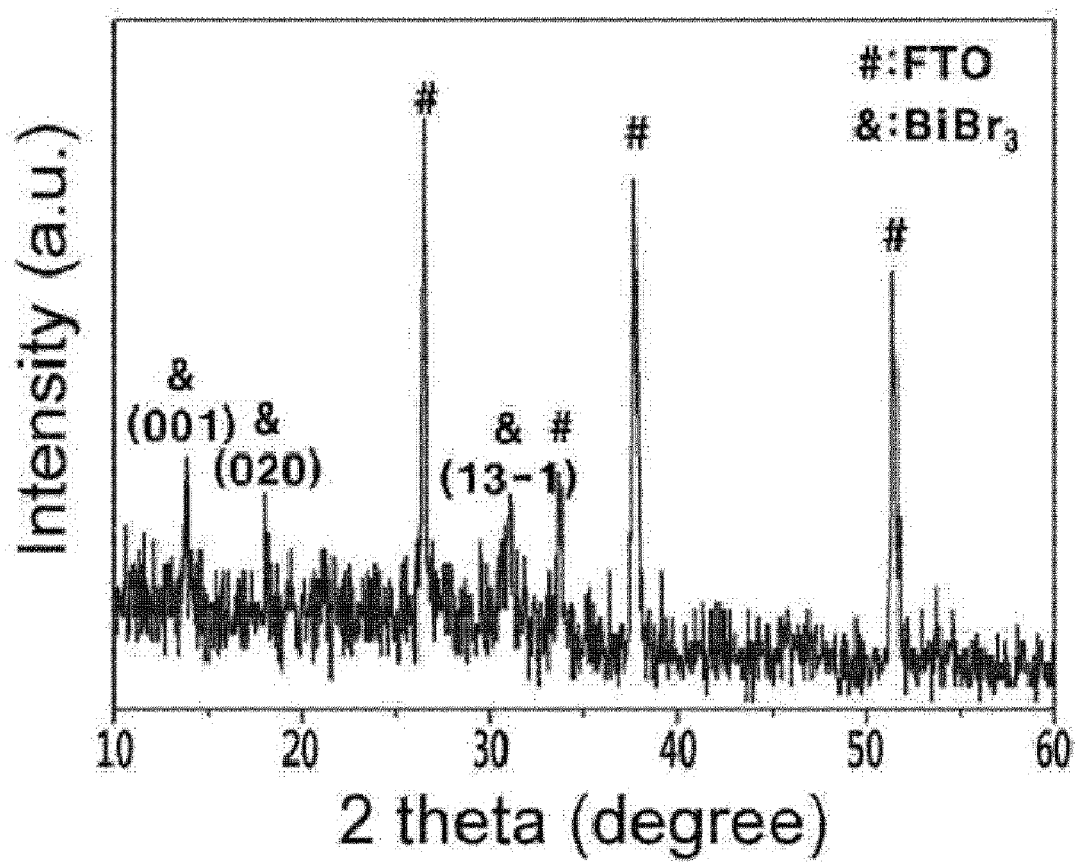
FIG. 5 is an XRD graph of $BiBr_3$ according to a comparative example of the present disclosure.

FIG. 4 is an XRD graph of $Bi(I/Br)_3$ according to an example of the present disclosure, and FIG. 5 is an XRD graph of $BiBr_3$ according to a comparative example of the present disclosure.

Referring to FIG. 4 and FIG. 5, it can be seen that $Bi(I/Br)_3$ (Example 1, Example 2, and Example 3) has low crystallinity and does not show an apparent peak, and, thus, it is difficult to find an accurate composition ratio of $Bi(I/Br)_3$. Meanwhile, it can be seen that in Comparative Example 2, $BiBr_3$ is formed.

Test Example 2

Figure 6:
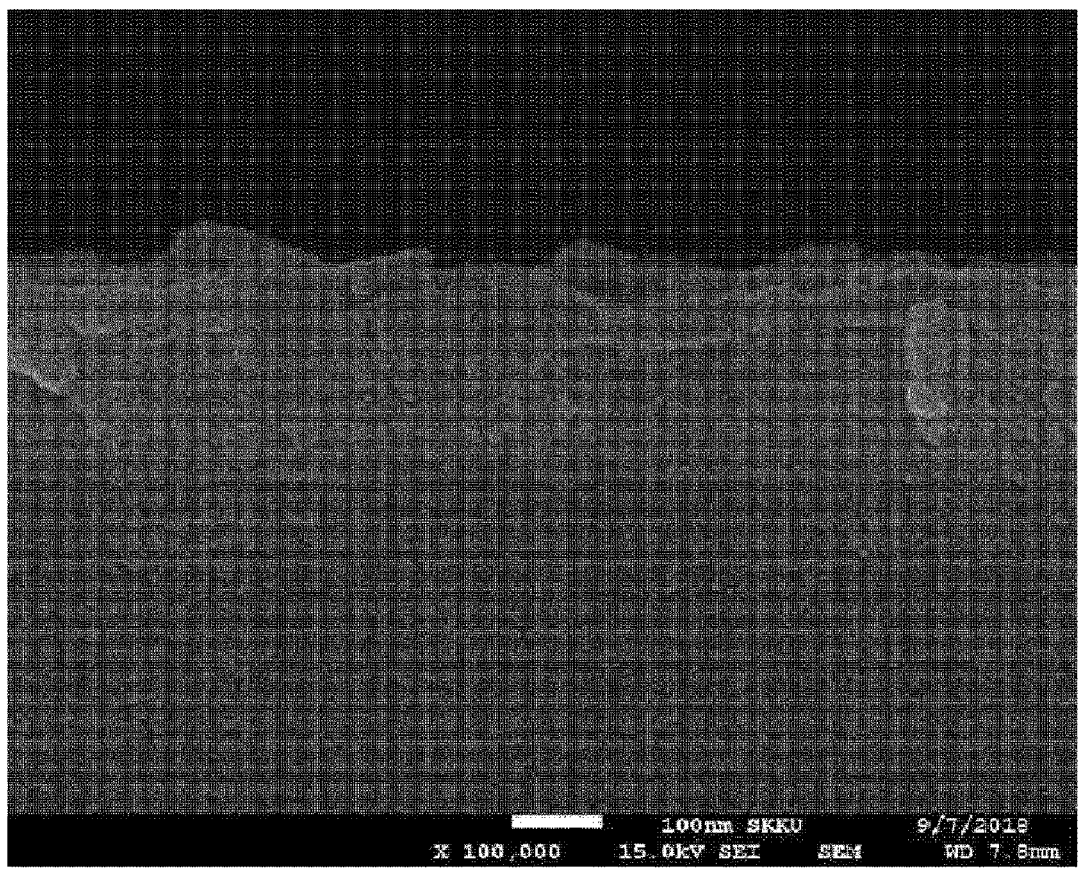
FIG. 6 is an SEM image showing the cross-section of $Bi(I/Br)_3$ according to an example of the present disclosure.
Figure 7:
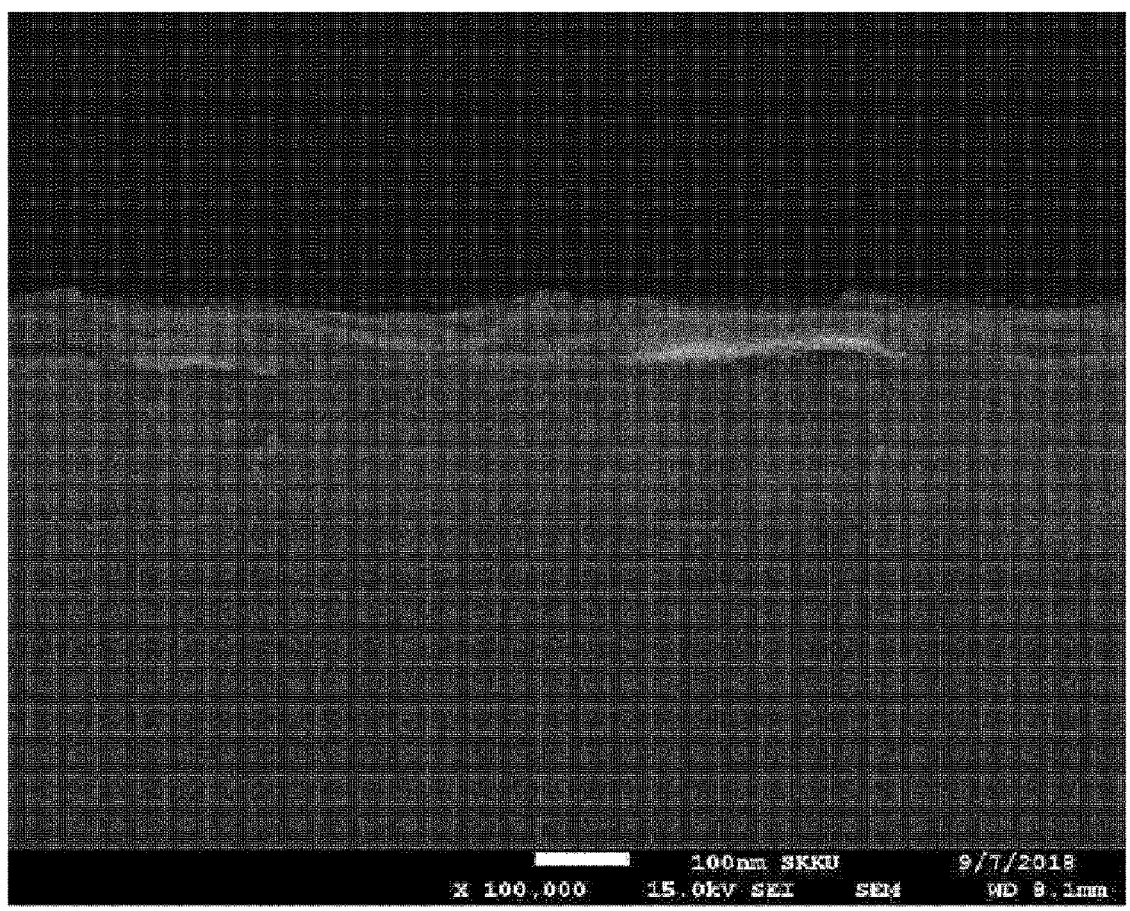
FIG. 7 is an SEM image showing the cross-section of $BiBr_3$ according to a comparative example of the present disclosure.

FIG. 6 is an SEM image showing the cross-section of $Bi(I/Br)_3$ according to an example of the present disclosure, and FIG. 7 is an SEM image showing the cross-section of $BiBr_3$ according to a comparative example of the present disclosure.

Referring to FIG. 6 and FIG. 7, it can be seen that $Bi(I/Br)_3$ and $BiBr_3$ thin films without including pin-holes were formed uniformly. The pin-holes may have a bad effect on the performance of the thin films, such as a decrease in breaking voltage of the device. However, the bismuth halide devices according to an example and a comparative example of the present disclosure do not include the pin-holes therein. Therefore, any problem caused by the pin-holes may not occur.

Test Example 3

Figure 8:
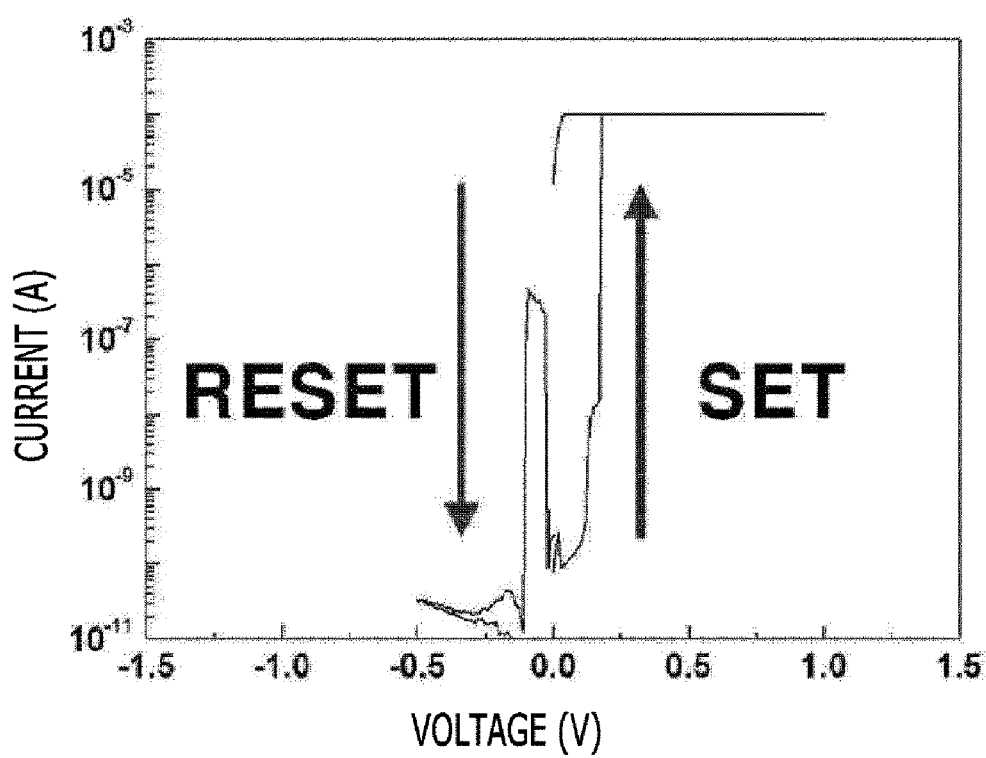
FIG. 8 is a voltage-current graph of $Bi(I_{0.7}/Br_{0.3})_3$ according to an example of the present disclosure.
Figure 9:
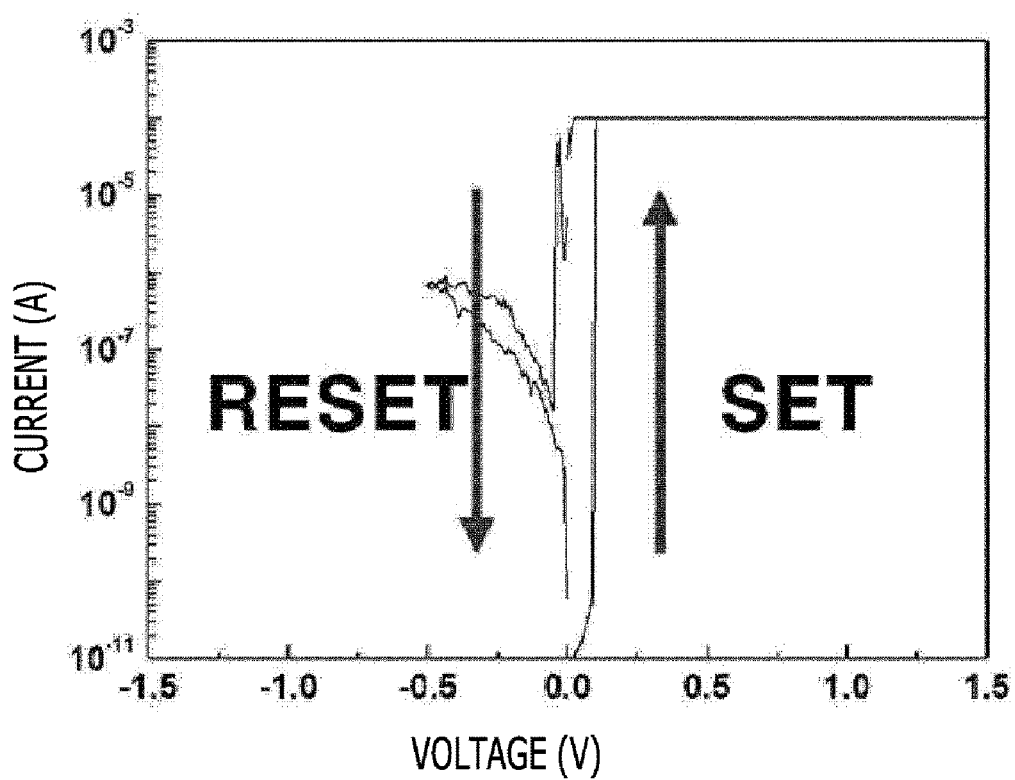
FIG. 9 is a voltage-current graph of $Bi(I_{0.5}/Br_{0.5})_3$ according to an example of the present disclosure.
Figure 10:
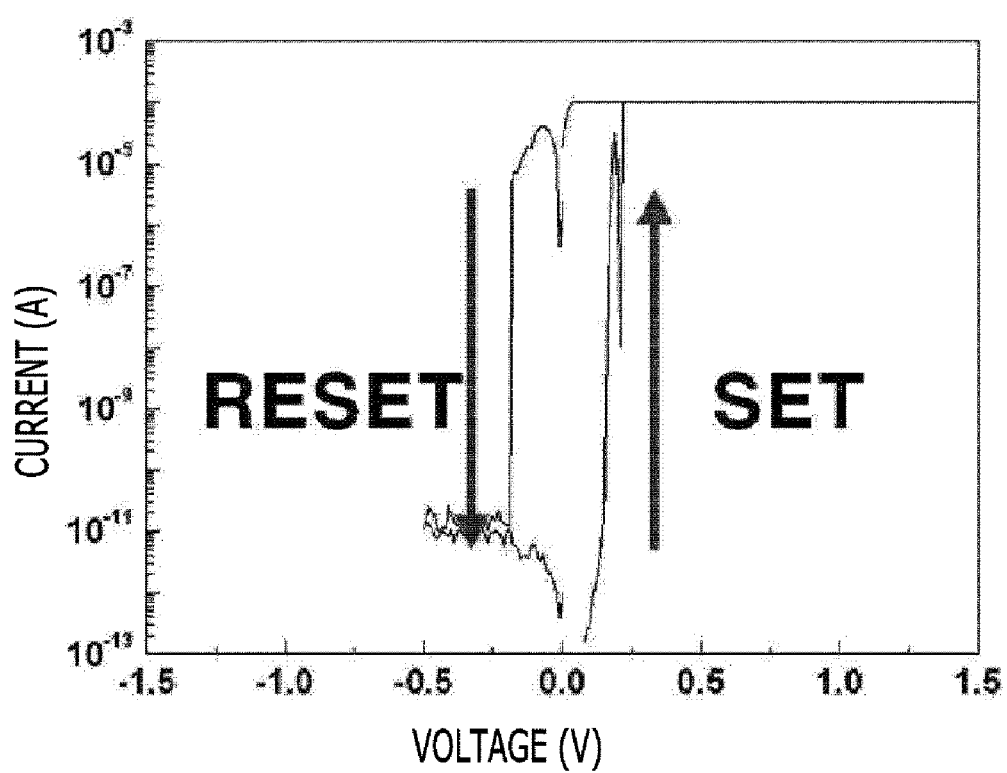
FIG. 10 is a voltage-current graph of $Bi(I_{0.3}/Br_{0.7})_3$ according to an example of the present disclosure.
Figure 11:
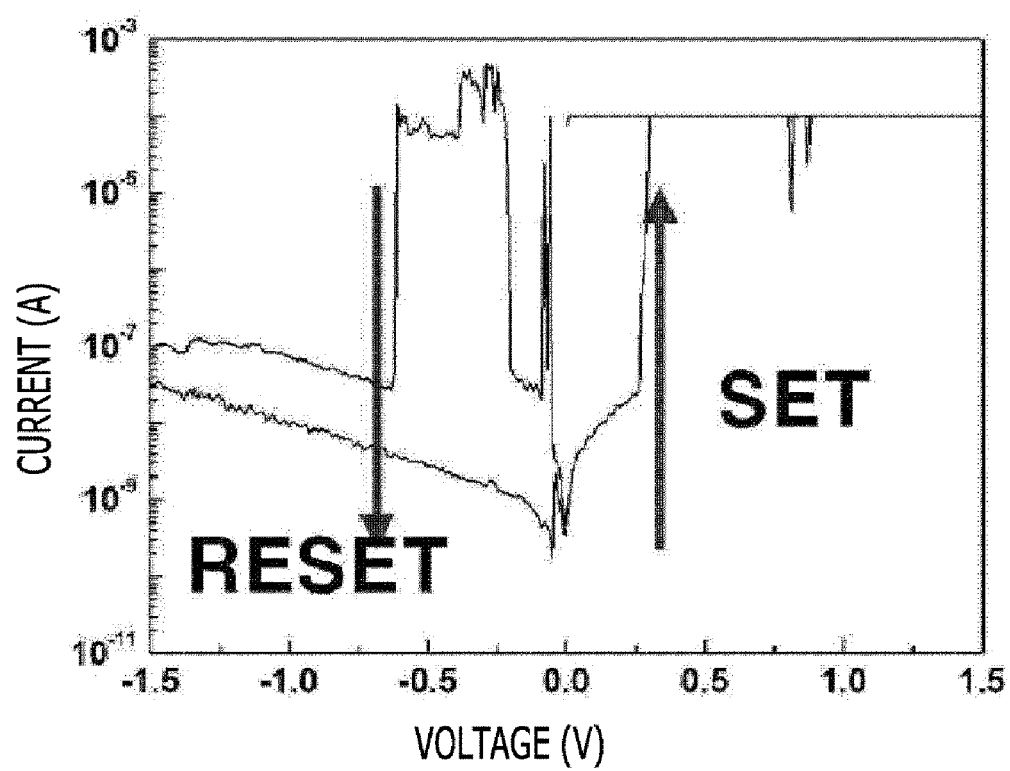
FIG. 11 is a voltage-current graph of $BiI_3$ according to a comparative example of the present disclosure.
Figure 12:
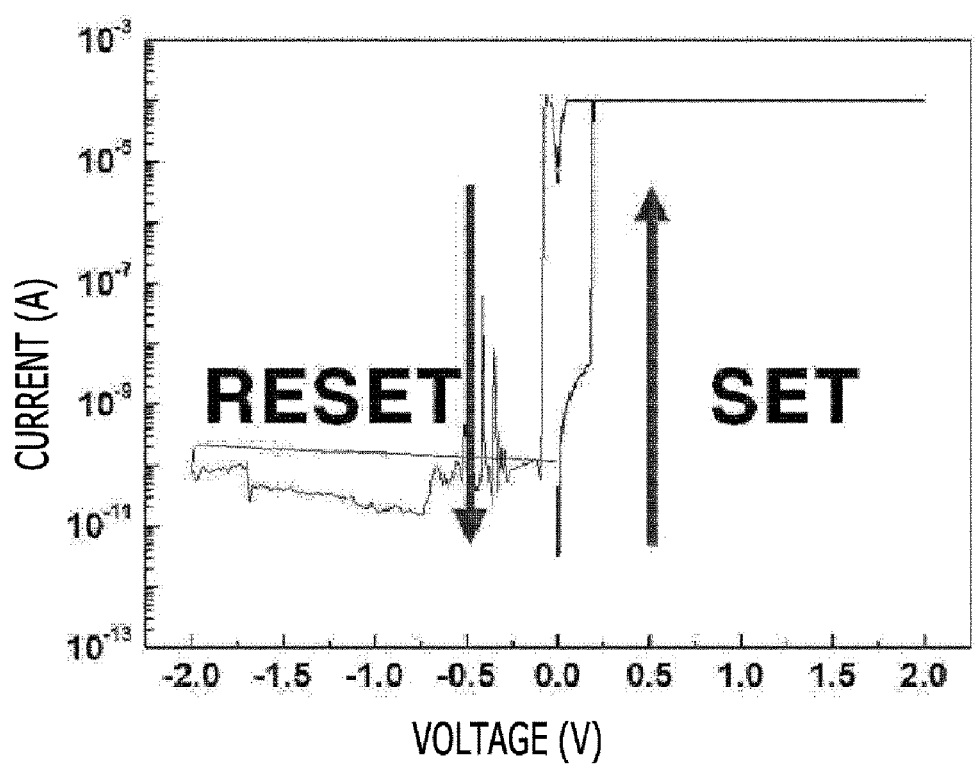
FIG. 12 is a voltage-current graph of $BiBr_3$ according to a comparative example of the present disclosure.

FIG. 8, FIG. 9, and FIG. 10 are voltage-current graphs of $Bi(I_{0.7}/Br_{0.3})_3$, $Bi(I_{0.5}/Br_{0.5})_3$, $Bi(I_{0.3}/Br_{0.3})_3$, respectively, according to an example of the present disclosure, and FIG. 10 and FIG. 11 are voltage-current graphs of $BiI_3$ and $BiBr_3$, respectively, according to a comparative example of the present disclosure.

By comparison between FIG. 8, FIG. 9, and FIG. 10 and FIG. 11 and FIG. 12, it can be seen that $Bi(I_{0.7}/Br_{0.3})_3$, $Bi(I_{0.5})_3$ and $Bi(I_{0.3}/Br_{0.7})_3$ have a narrower range of a driving voltage than $BiI_3$ and $BiBr_3$. Further, it can be seen that the bismuth halide materials commonly mentioned in Examples and Comparative Examples have a driving voltage in the range of from $-1.0$ V to $+1.0$ V and thus are operated at low power.

Test Example 4

Figure 13:
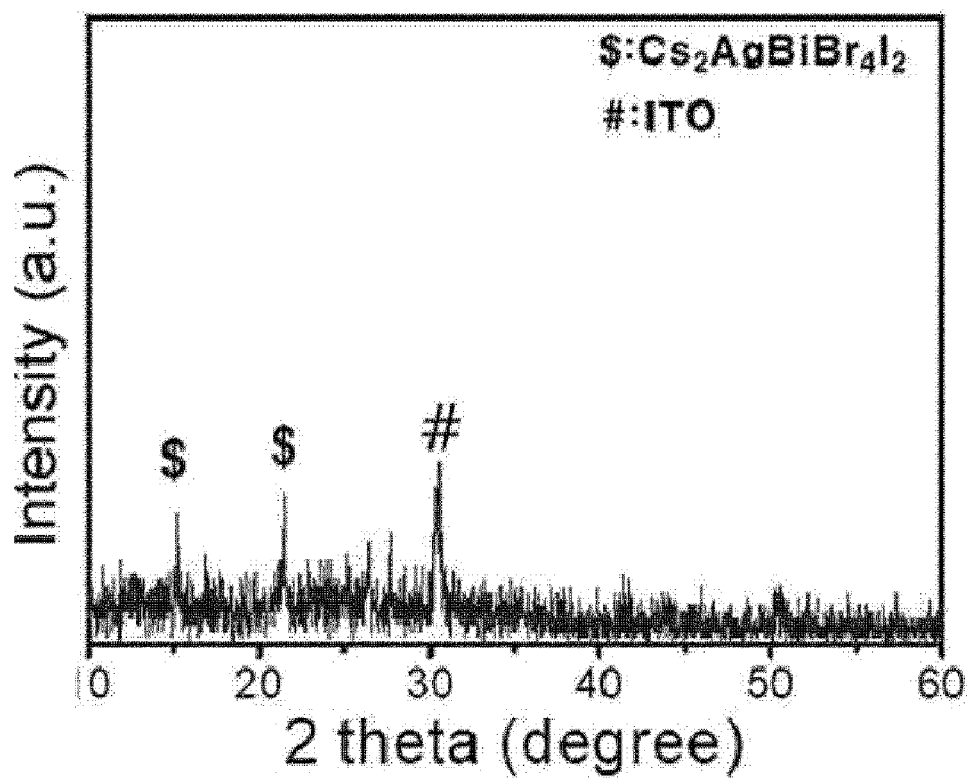
FIG. 13 is an XRD graph of Cs2AgBiBr6 according to an example of the present disclosure.

FIG. 13 is an XRD graph of $Cs_2AgBiBr_4I_2$ according to an example of the present disclosure, and FIG. 14 is an XRD graph of $Cs_2AgBiBr_6$ according to a comparative example of the present disclosure.

$Cs_2AgBiBr_4I_2$ and $Cs_2AgBiBr_4I_6$ commonly have an elpasolite structure. By comparison between peaks of $Cs_2AgBiBr_4I_2$ and peaks of $Cs_2AgBiBr_6$, it was observed that the peaks of $Cs_2AgBiBr_6$ were shifted by doping with I and $Cs_2AgBiBr_4I_2$ was formed. As for $Cs_2AgBiBr_6$, XRD peaks show that crystals of $Cs_2AgBiBr_6$ are formed.

Test Example 5

Figure 15:
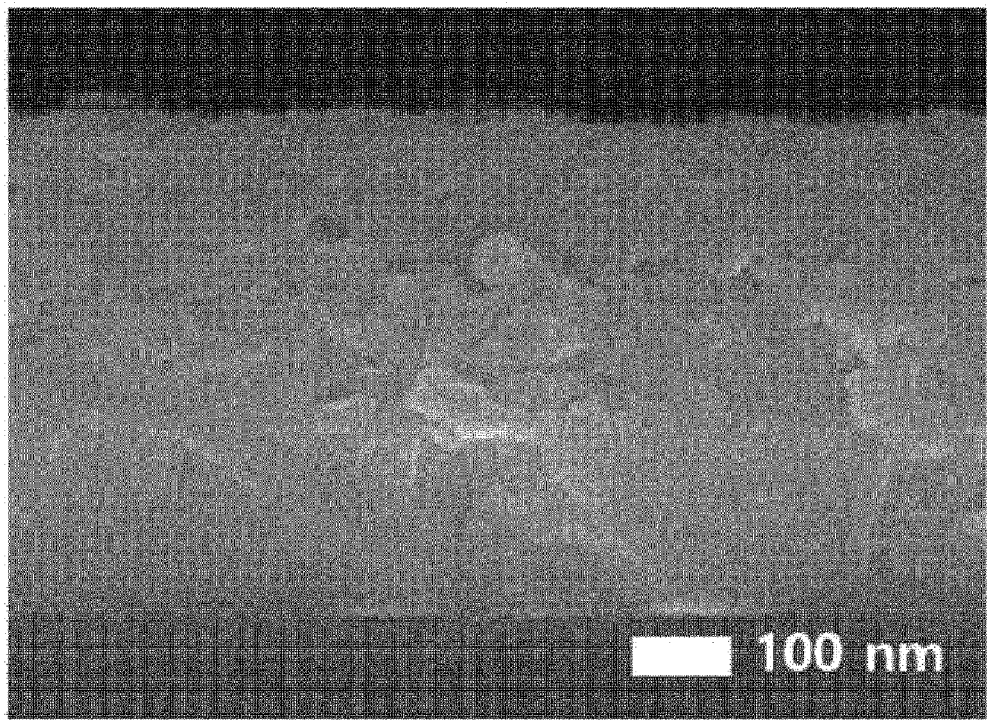
FIG. 15 is an SEM image showing the cross-section of $Cs_2AgBiBr_4I_2$ according to an example of the present disclosure.
Figure 16:
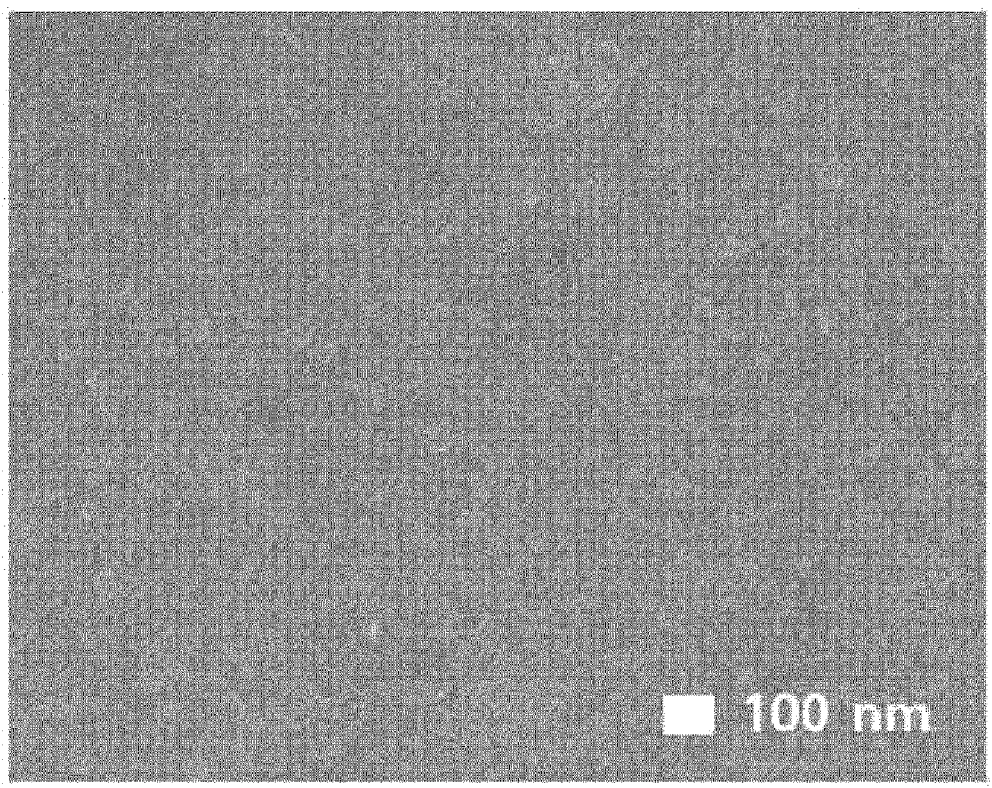
FIG. 16 is an SEM image showing the cross-section of $Cs_2AgBiBr_4I_2$ according to an example of the present disclosure.
Figure 17:
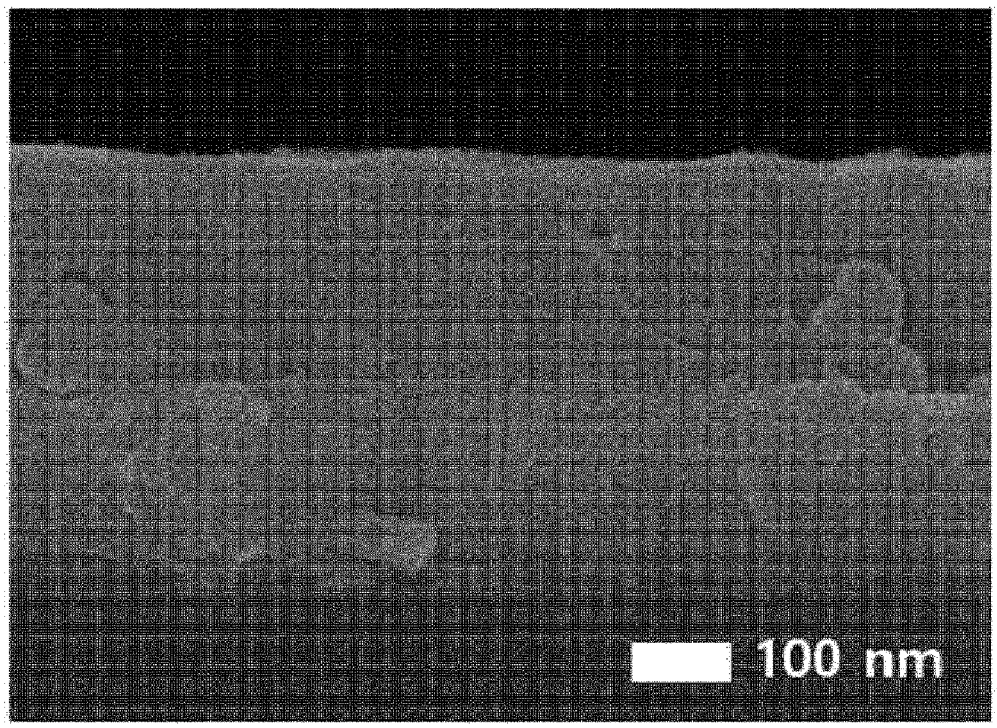
FIG. 17 is an SEM image showing the cross-section of $Cs_2AgBiBr_6$ according to a comparative example of the present disclosure.
Figure 18:
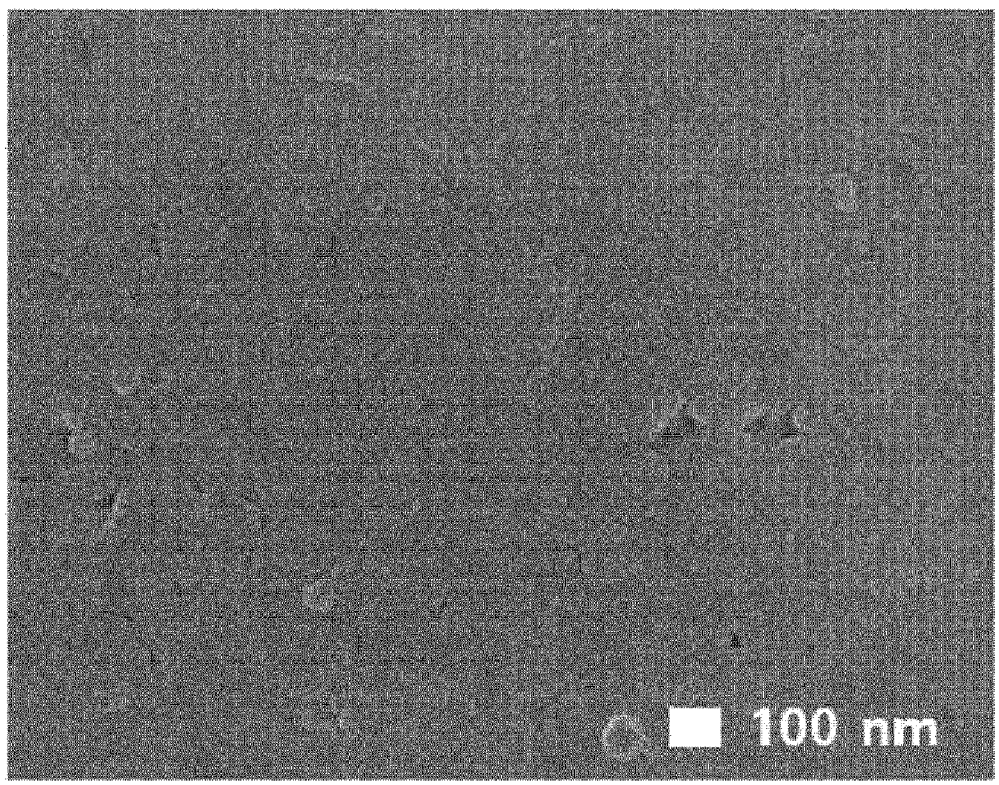
FIG. 18 is an SEM image showing the surface of $Cs_2AgBiBr_6$ according to a comparative example of the present disclosure.

FIG. 15 and FIG. 16 are SEM images showing the cross-section and the surface, respectively, of $Cs_2AgBiBr_4I_2$ according to an example of the present disclosure, and FIG. 17 and FIG. 18 are SEM images showing the cross-section and the surface, respectively, of $Cs_2AgBiBr_6$ according to a comparative example of the present disclosure.

Referring to FIG. 15 to FIG. 18, it can be seen that $Cs_2AgBiBr_4I_2$ and $Cs_2AgBiBr_6$ thin films without including pin-holes were formed uniformly. The pin-holes may have a bad effect on the performance of the thin films, such as a decrease in breaking voltage of the device. However, the elpasolite devices according to an example and a comparative example of the present disclosure do not include the pin-holes therein. Therefore, any problem caused by the pin-holes may not occur.

Test Example 6

Figure 19:
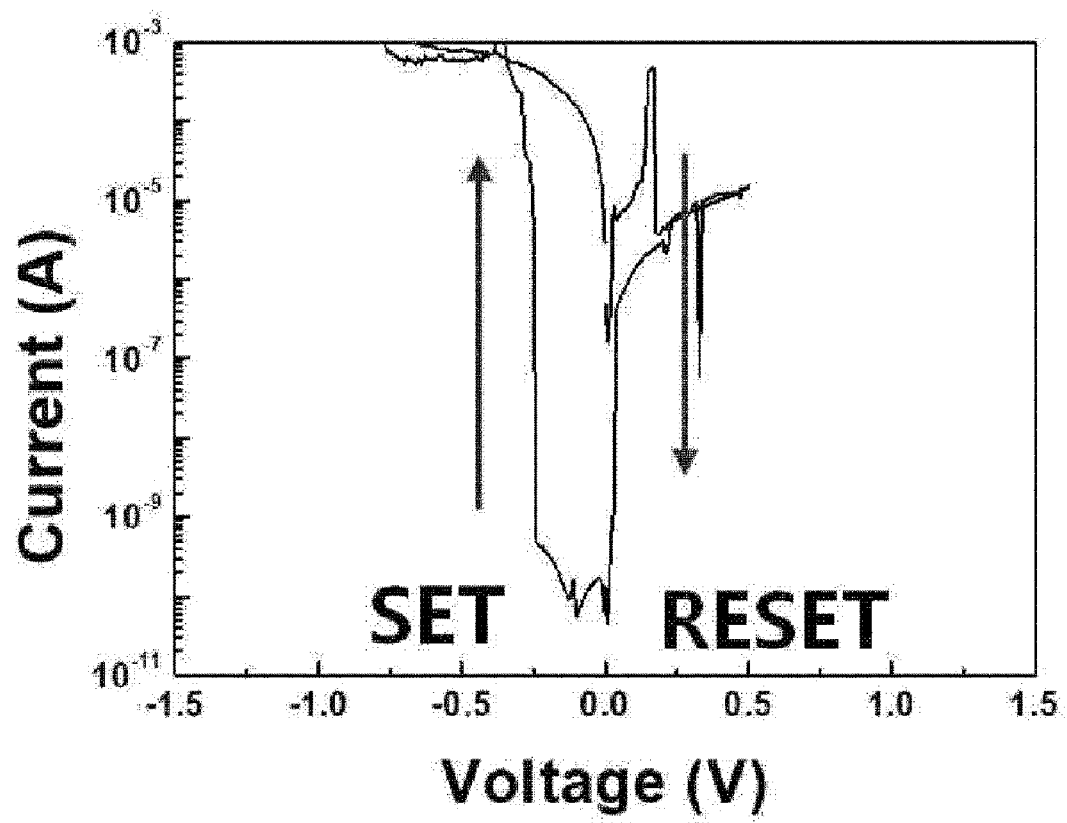
FIG. 19 is a voltage-current graph of $Cs_2AgBiBr_4I_2$ according to an example of the present disclosure.
Figure 20:
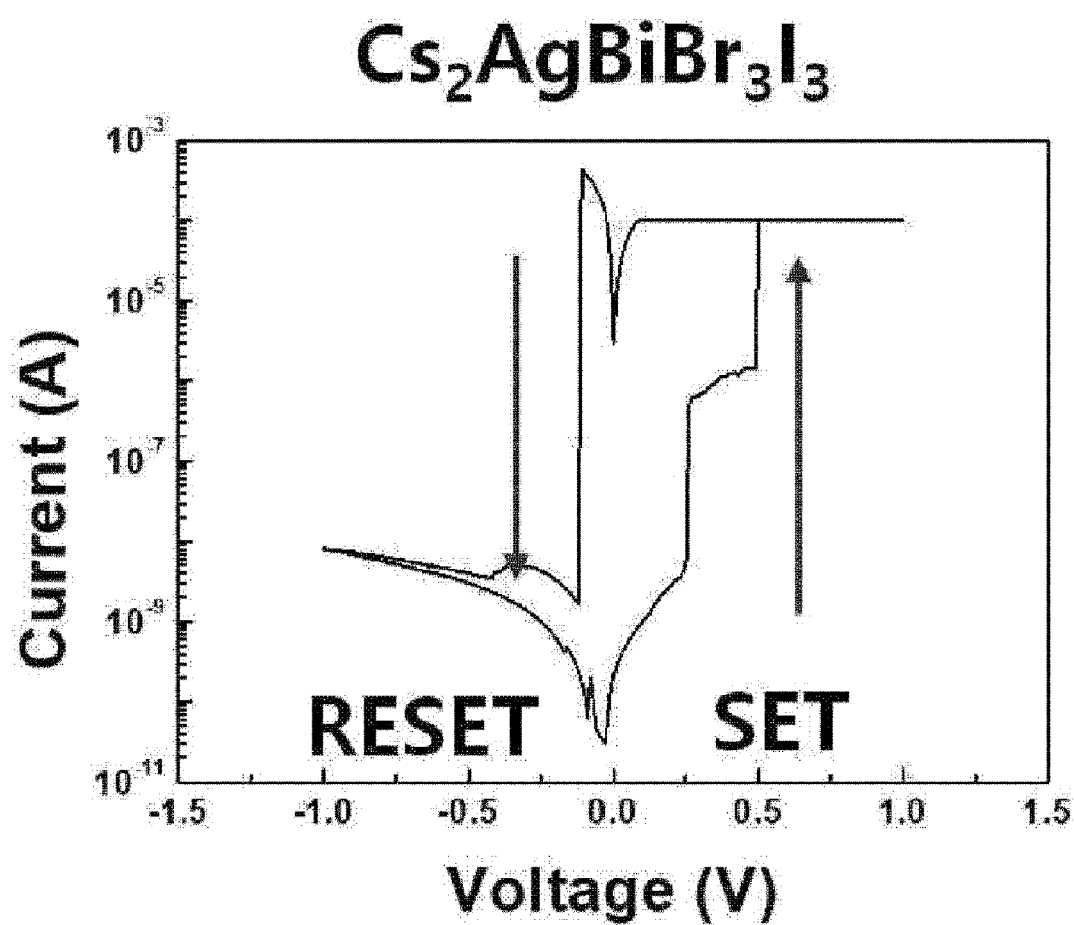
FIG. 20 is a voltage-current graph of $Cs_2AgBiBr_3I_3$ according to an example of the present disclosure.
Figure 21:
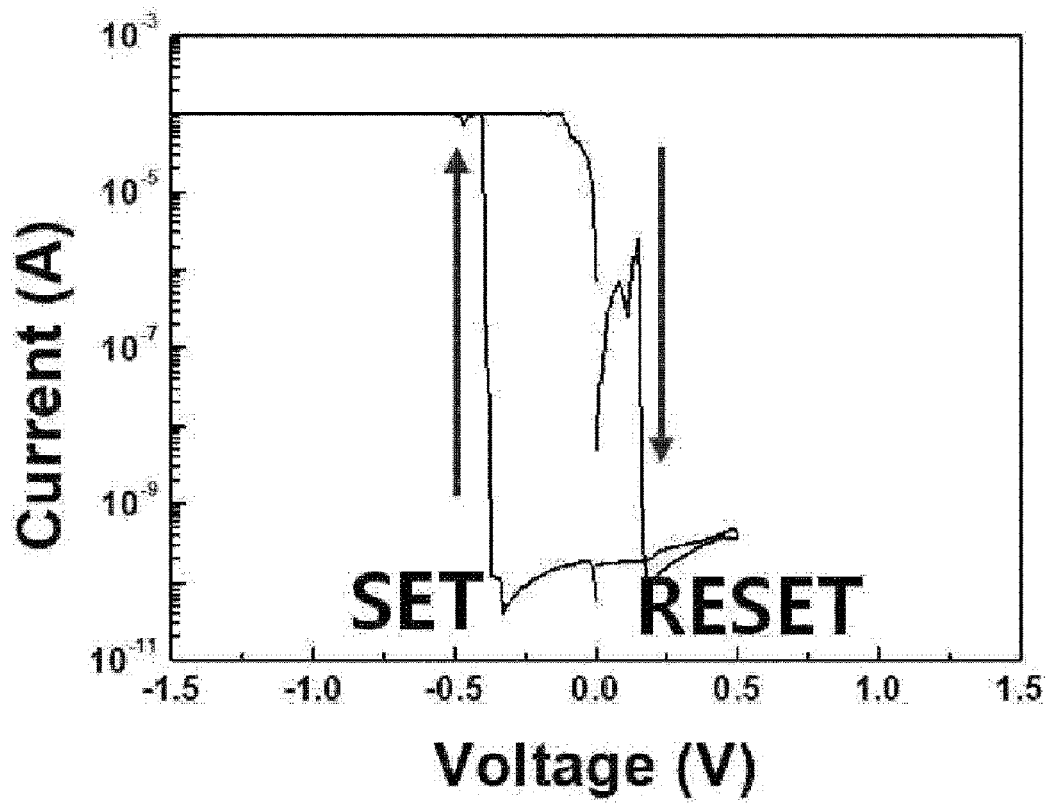
FIG. 21 is a voltage-current graph of $Cs_2AgBiBr_6$ according to a comparative example of the present disclosure.
Figure 22:
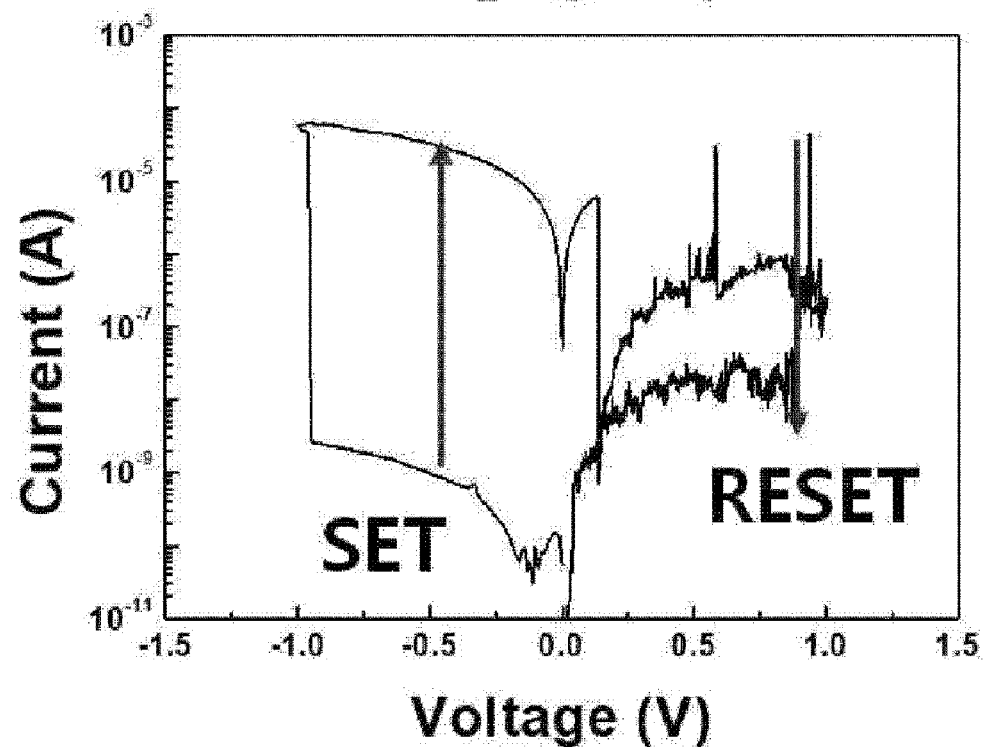
FIG. 22 is a voltage-current graph of $Cs_2AgBiI_6$ according to a comparative example of the present disclosure.

FIG. 19 and FIG. 20 are voltage-current graphs of $Cs_2AgBiBr_4I_2$ and $Cs_2AgBiBr_3I_3$, respectively, according to an example of the present disclosure, and FIG. 21 and FIG. 22 are voltage-current graphs of $Cs_2AgBiBr_6$ and $Cs_2AgBiI_6$, respectively, according to a comparative example of the present disclosure.

Referring to FIG. 19, it can be seen that $Cs_2AgBiBr_4I_2$ has a driving voltage in the range of from $-0.24$ V to $+0.20$ V and a current on/off ratio is $10^4$ in the above-described range of driving voltage.

Referring to FIG. 20, it can be seen that $Cs_2AgBiBr_4I_3$ has a driving voltage in the range of from $-0.16$ V to $+0.47$ V and a current on/off ratio is $10^4$ in the above-described range of driving voltage.

Referring to FIG. 21, it can be seen that $Cs_2AgBiBr_6$ has a driving voltage in the range of from $-0.37$ V to $+0.21$ V and a current on/off ratio is $10^4$ in the above-described range of driving voltage.

Referring to FIG. 22, it can be seen that $Cs_2AgBiI_6$ has a driving voltage in the range of from $-0.95$ V to $+0.16$ V and a current on/off ratio is $10^4$ in the above-described range of driving voltage.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

100: First electrode
200: Resistance change layer
300: Polymer protective layer
400: Second electrode

We claim:

1. A resistance random access memory device, comprising:
    a first electrode;
    a resistance change layer comprising a $Cs_2AgBiBr_xI_{6-x}$ thin film (where 0≤x≤6) having an elpasolite structure, and formed on the first electrode; and
    a second electrode formed on the resistance change layer,
    wherein the first electrode and the second electrode are arranged perpendicular to each other with the resistance change layer containing no lead (Pb) disposed therebetween to form a crossbar array structure, and
    wherein the resistance change layer is configured to change in resistance due to a movement of atoms or electrons caused by the movement of I ions or point defects in the resistance change layer.

2. The resistance random access memory device of claim 1, wherein the resistance random access memory device has a driving voltage in the range of from −1.0 V to +1.0 V.

3. The resistance random access memory device of claim 1, wherein the first electrode and the second electrode arranged perpendicular to each other are configured to generate a local electric field that is applied to the resistance change layer to move electrons in the resistance change layer.

4. The resistance random access memory device of claim 1, further comprising:
    a polymer protective layer formed on the resistance change layer.

5. The resistance random access memory device of claim 4, wherein the polymer protective layer contains a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride hexafluoropropylene, polyethyleneimine, polyphenylene terephthalamide, polymethoxy polyethylene glycol methacrylate, poly(2-methoxyethyl glycidyl ether), and combinations thereof.

6. The resistance random access memory device of claim 1, wherein the first electrode and the second electrode contain each independently a material selected from the group consisting of Pt, Ti, Ag, Au, Ni, Zr, Ta, Zn, Nb, Cr, Co, Mn, Fe, Al, Mg, Si, W, Cu, lanthanum-based metals, nitrides thereof, oxides thereof, and combinations thereof.

* * * * *